(12) United States Patent
Yamazaki

(10) Patent No.: US 7,863,705 B2
(45) Date of Patent: Jan. 4, 2011

(54) SEMICONDUCTOR DEVICE HAVING A BONDING PAD STRUCTURE INCLUDING AN ANNULAR CONTACT

(75) Inventor: Yasushi Yamazaki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 260 days.

(21) Appl. No.: 11/285,057

(22) Filed: Nov. 23, 2005

(65) Prior Publication Data

US 2006/0125118 A1     Jun. 15, 2006

(30) Foreign Application Priority Data

Dec. 10, 2004    (JP) .............................. 2004-357652

(51) Int. Cl.
 *H01L 23/52*   (2006.01)
 *H01L 31/00*   (2006.01)
(52) U.S. Cl. ................. 257/459; 257/503; 257/734; 257/739; 257/758; 257/759; 257/760; 257/773; 257/774; 257/779; 257/784; 257/786
(58) Field of Classification Search ................. None
 See application file for complete search history.

(56) References Cited

U.S. PATENT DOCUMENTS

| | | | | |
|---|---|---|---|---|
| 5,248,903 A * | 9/1993 | Heim | .......................... | 257/748 |
| 5,502,337 A * | 3/1996 | Nozaki | .......................... | 257/773 |
| 5,736,791 A * | 4/1998 | Fujiki et al. | .................. | 257/781 |
| 5,739,587 A * | 4/1998 | Sato | .............................. | 257/758 |
| 5,986,343 A * | 11/1999 | Chittipeddi et al. | .......... | 257/758 |
| 5,986,346 A * | 11/1999 | Katoh | .......................... | 257/773 |
| 6,028,367 A * | 2/2000 | Yu | ................................ | 257/780 |
| 6,100,589 A * | 8/2000 | Tanaka | ........................ | 257/758 |
| 6,222,270 B1 * | 4/2001 | Lee | .............................. | 257/758 |
| 6,313,537 B1 * | 11/2001 | Lee et al. | .................... | 257/758 |
| 6,313,540 B1 * | 11/2001 | Kida et al. | .................. | 257/784 |
| 6,353,262 B1 * | 3/2002 | Honda | ........................ | 257/773 |
| 6,372,409 B1 * | 4/2002 | Yu | ................................ | 430/313 |
| 6,448,641 B2 * | 9/2002 | Ker et al. | ..................... | 257/700 |
| 6,448,650 B1 * | 9/2002 | Saran et al. | .................. | 257/758 |
| 6,465,337 B1 * | 10/2002 | Lee et al. | ..................... | 438/612 |
| 6,489,228 B1 * | 12/2002 | Vigna et al. | ................. | 438/612 |
| 6,522,021 B2 * | 2/2003 | Sakihama et al. | ........... | 257/784 |
| 6,551,916 B2 * | 4/2003 | Lin et al. | ..................... | 438/612 |
| 6,552,438 B2 * | 4/2003 | Lee et al. | ..................... | 257/784 |
| 6,566,752 B2 * | 5/2003 | Hsia et al. | ................... | 257/734 |
| 6,756,675 B1 * | 6/2004 | Tanaka | ........................ | 257/758 |
| 6,787,928 B1 * | 9/2004 | Lin | .............................. | 257/786 |
| 6,803,302 B2 * | 10/2004 | Pozder et al. | ............... | 438/612 |
| 6,818,540 B2 * | 11/2004 | Saran et al. | ................. | 438/612 |
| 6,822,329 B2 * | 11/2004 | Varrot et al. | ................. | 257/758 |

(Continued)

FOREIGN PATENT DOCUMENTS

JP    2000-58583    2/2000

(Continued)

*Primary Examiner*—David E Graybill
(74) *Attorney, Agent, or Firm*—Young & Thompson

(57) ABSTRACT

A bonding pad structure in a semiconductor device includes a contact pad connected to an interconnect, a bonding pad overlying the contact pad with an intervention of an insulating film and exposed from an opening of a passivation film, and an annular contact disposed between the contact pad and the bonding pad for electric connection therebetween. The annular contact encircles the opening as viewed normal to the substrate surface.

14 Claims, 6 Drawing Sheets

U.S. PATENT DOCUMENTS

| | | | | |
|---|---|---|---|---|
| 6,828,681 | B2 * | 12/2004 | Furuhata | 257/758 |
| 6,875,682 | B1 * | 4/2005 | Liu et al. | 438/612 |
| 6,908,841 | B2 * | 6/2005 | Burrell et al. | 438/612 |
| 6,909,196 | B2 * | 6/2005 | Batra et al. | 257/781 |
| 6,921,714 | B2 * | 7/2005 | Yamaha | 438/612 |
| 6,927,498 | B2 * | 8/2005 | Huang et al. | 257/786 |
| 6,955,981 | B2 * | 10/2005 | Lee et al. | 438/612 |
| 7,081,679 | B2 * | 7/2006 | Huang et al. | 257/779 |
| 7,135,395 | B2 * | 11/2006 | Liu et al. | 438/612 |
| 7,148,574 | B2 * | 12/2006 | Lee et al. | 257/773 |
| 7,160,795 | B2 * | 1/2007 | Batra et al. | 438/612 |
| 7,169,694 | B2 * | 1/2007 | Pozder et al. | 438/612 |
| 7,199,042 | B2 * | 4/2007 | Ozawa | 438/624 |
| 7,202,565 | B2 * | 4/2007 | Matsuura et al. | 257/758 |
| 7,242,102 | B2 * | 7/2007 | Kang et al. | 257/786 |
| 7,250,681 | B2 * | 7/2007 | Matsunaga | 257/758 |
| 7,453,158 | B2 * | 11/2008 | Singh et al. | 257/786 |
| 7,465,653 | B2 * | 12/2008 | Huang et al. | 438/613 |
| 7,495,343 | B1 * | 2/2009 | Singh et al. | 257/786 |
| 2003/0178644 | A1 * | 9/2003 | Lee et al. | 257/200 |
| 2003/0222354 | A1 * | 12/2003 | Mastromatteo et al. | 257/774 |
| 2003/0234448 | A1 * | 12/2003 | Batra et al. | 257/758 |
| 2003/0235018 | A1 * | 12/2003 | Batra et al. | 361/48 |
| 2004/0188826 | A1 * | 9/2004 | Palanduz et al. | 257/700 |
| 2005/0062162 | A1 * | 3/2005 | Shen et al. | 257/758 |
| 2005/0067709 | A1 * | 3/2005 | Bachman et al. | 257/763 |
| 2005/0082577 | A1 * | 4/2005 | Usui | 257/211 |
| 2005/0167842 | A1 * | 8/2005 | Nakamura et al. | 257/758 |
| 2006/0006547 | A1 * | 1/2006 | Matsunaga | 257/774 |
| 2006/0125118 | A1 * | 6/2006 | Yamazaki | 257/784 |
| 2009/0050940 | A1 * | 2/2009 | Hayashi et al. | 257/203 |

FOREIGN PATENT DOCUMENTS

JP    2001-085465    3/2001

\* cited by examiner

SEMICONDUCTOR DEVICE HAVING A BONDING PAD STRUCTURE INCLUDING AN ANNULAR CONTACT

BACKGROUND OF THE INVENTION (a) Field of the Invention

The present invention relates to a semiconductor device having a bonding pad and, more particularly, to the structure of a bonding pad for suppressing growth of a crack in an insulating film.

(b) Description of the Related Art

Semiconductor devices such as LSIs have bonding pads overlying active elements, such as transistor and capacitor, that are formed on a semiconductor substrate. The bonding pad is connected to an underlying active element via a contact plug and an interconnect formed within an interlevel dielectric film. The bonding pad is disposed on the outer surface of the semiconductor device, and is electrically connected to an external line via a boding wire or bump.

FIG. 5A exemplifies the structure of a bonding pad in a conventional semiconductor device, and FIG. 5B shows a sectional view taken along line B-B' in FIG. 5A. The semiconductor device, generally designated by numeral 40, includes a first interlevel dielectric film 11 formed on underlying active elements (not shown). On the first interlevel dielectric film 11 are formed first interconnects 12 and contact pads (first pads) 12a both made of Al. A second interlevel dielectric film 13 is formed on the first interlevel dielectric film 11, first interconnects 12 and contact pads 12a.

A plurality of contact holes 41 are formed in the second interlevel dielectric film 13, and are filled with contact plugs 42. The contact plugs 42 includes, for example, a barrier metal layer in contact with the wall of the contact hole 41, and a high-melting-point metal layer filling the contact hole 41 via the barrier metal layer.

On the second interlevel dielectric film 13 are formed second interconnects (not shown) and bonding pads (second pads) 16. The bonding pads 16 are in contact with the top of the contact plugs 42. A passivation film (cover film) 17 covers the bonding pads 16, and has openings 17a which expose a central portion of the bonding pads 16.

It is known in the conventional semiconductor device that a wafer test or bonding process applies a thrust force onto the surface of the bonding pad 16 to generate a crack in an interlevel dielectric film. FIG. 6 shows an example of the wafer test using a probe pin 21, wherein the probe pin 21 applies a thrust on the bonding pad 16 which in turn causes occurring of a crack 22 in the second interlevel dielectric film 13. The crack formed in the second interlevel dielectric film 13 may eventually grow and reach the first interconnect. In such a case, external water may enter the semiconductor device along the crack. The ingress of water causes corrosion of interconnects to degrade the reliability of the semiconductor device.

In general, the recent development of higher-integrated semiconductor devices decreases the distance between the bonding pad and the interconnect, resulting in a larger possibility that the crack incurs a malfunction on the interconnect. Thus, it is necessary to prevent occurring of the cracks especially in the higher-integrated semiconductor device.

Patent Publication JP-A-2001-85465 describes suppression of cracks by disposing the bonding pads in an array, the bonding pads having a higher concentration of a metal element having a higher rigidity. This technique improves the mechanical strength of the bonding pad area, i.e., area of the insulation film where the bonding pads are disposed.

DISCLOSURE OF THE INVENTION (a) Problems to be Solved by the Invention

Samples of the semiconductor device described in the above publication were manufactured and examined for the mechanical strength thereof by performing a wafer test wherein bonding pads were contacted by probe pins. The results of the examination revealed that although some improvement was observed in prevention of the cracks, the improvement was insufficient for obtaining a higher-reliability semiconductor device. The thrust or impact applied onto the bonding pad area caused a stress concentration at the intersection of the row and column of the bonding pads, and a crack was formed at the intersection as a starting point of growth.

In view of the above, it is an object of the present invention to provide a semiconductor device including a bonding pad structure having a higher resistance against occurring of a crack formed in a bonding pad area of the semiconductor device.

The present invention provides a semiconductor device including: a substrate; a first pad overlying the substrate and connected to an interconnect; an insulating film formed on the first pad; a second pad formed on the insulating film and overlying the first pad; a passivation film formed on the second pad and having an opening exposing at least a central area of the second pad; and an annular contact disposed within the insulating film between the first pad and the second pad for connecting together the first pad and the second pad, the annular contact encircling the opening as viewed normal to the substrate.

In accordance with the semiconductor device of the present invention, due to the annular contact encircling the opening exposing therefrom the central area of the second pad, a crack formed in the insulating film by the thrust of the probe pin in contact with the bonding pad within the opening stays within the annular contact, and scarcely causes occurring of a crack outside the annular contact. Thus, ingress of water toward an interconnect does not occur, and thus the reliability of the semiconductor device is not degraded by the wafer test.

The above and other objects, features and advantages of the present invention will be more apparent from the following description, referring to the accompanying drawings.

PREFERRED EMBODIMENT OF THE INVENTION

The principle of the present invention will be described before describing preferred embodiments of the present invention. The present inventor investigated measures for suppressing the malfunction in the semiconductor device caused by the cracks formed in the bonding pad area.

After the investigation, it is concluded that occurring of the cracks cannot be avoided simply by increasing the mechanical strength of the insulating film in the bonding pad area, and that suppression of occurring of the malfunction can be obtained by blocking the growth of the crack by encircling the start point of the growth within a small area of the insulating film. The present inventor perceived that the encircling of the start point of the growth can be obtained by a bonding pad structure having an annular contact which encircles the portion of the insulating film.

Figure 6:
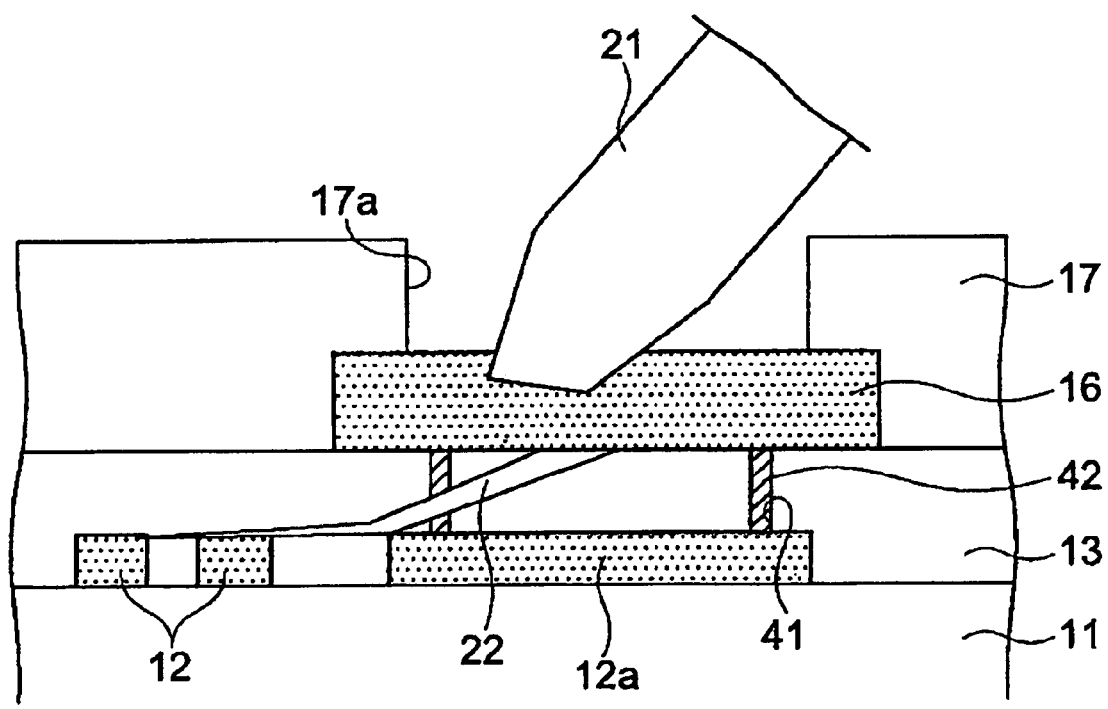
FIG. 6 is a sectional view of the bonding pad of FIGS. 5A and 5B during a wafer test using a probe pin.

Based on the above findings, samples of the semiconductor device having a bonding pad structure including the annular contact were manufactured, and subjected to a wafer test using a probe pin such as shown in FIG. 6. Most of the samples exhibited a superior result after the wafer test; however, some of the samples had a crack after the wafer test, wherein the crack was formed also in the portion of the insulating film outside the annular contact.

The crack observed was formed as a secondary crack occurring as a result of occurring of a first crack, which was formed within the annular contact of the bonding pad. In view of this fact, the preferable structure for the bonding pad is that double annular contacts are formed in the insulating film. The double annular contacts were examined and exhibited a superior result in that substantially all the bonding pad areas examined had no cracks outside the double annular contacts after the wafer test.

Another preferable structure is that the bonding pad area includes reinforcement contacts formed in the insulating film to reinforce the annular contact.

Now, the present invention is more specifically described with reference to accompanying drawings, wherein similar constituent elements are designated by similar reference numerals throughout the drawings.

Figure 1A:
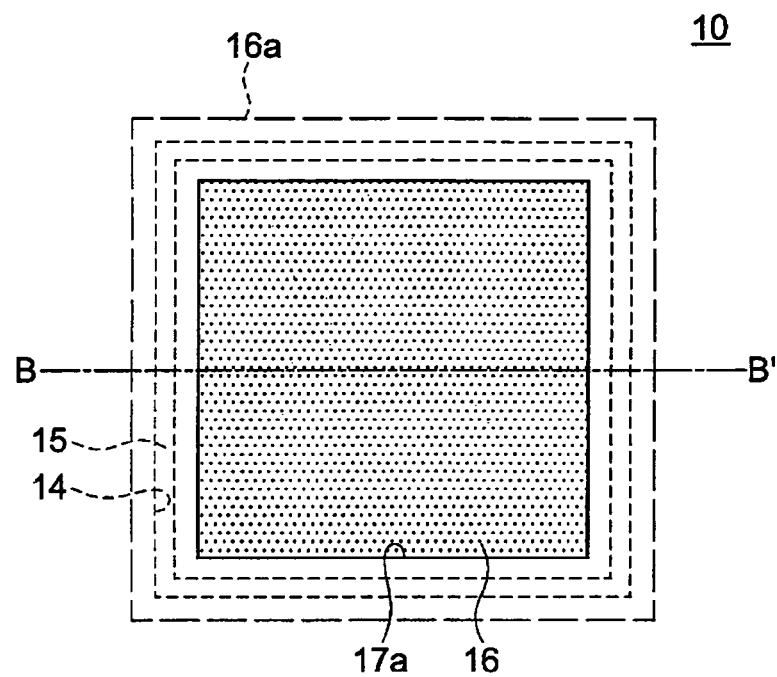
FIG. 1A is a top plan view of a bonding pad formed in a semiconductor device according to a first embodiment of the present invention.
Figure 1B:
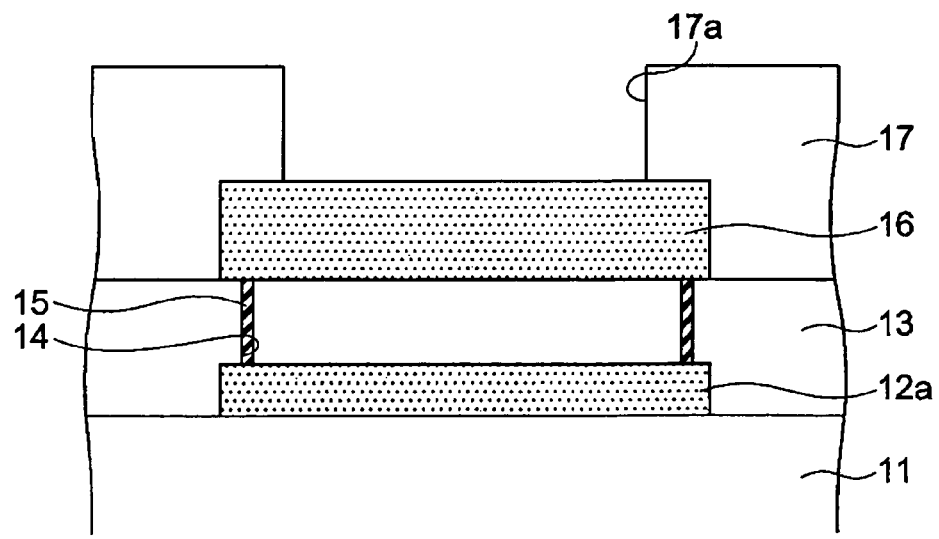
FIG. 1B is a sectional view taken along line B-B' in FIG. 1A.

Referring to FIGS. 1A and 1B, a semiconductor device according to a first embodiment of the present invention has a bonding pad structure which is similar to the bonding pad structure in the conventional semiconductor device except for the structure of the contact disposed between the contact pad (first pad) and the bonding pad (second pad).

More specifically, the semiconductor device includes a first interlevel dielectric film 11 overlying active elements not shown, and first pads (contact pads) 12a formed on the first interlevel dielectric film 11 and connected to first interconnects (not shown) formed as a common layer with the first pads 12a. The first pads 12a and first interconnects are made of Al having a thickness of about 400 nm. The first pads 12a are of a square shape having a side of about 100 μm. A second interlevel dielectric film 13 made of silicon oxide and having a thickness of about 600 nm overlies the first interconnects, first pads 12a and second interlevel dielectric film 11.

The second interlevel dielectric film 13 has therein annular contact holes 14 exposing therethrough top of the first pads 12a. The contact holes 14 have a width of 0.5 μm, and an inner edge and an outer edge both of a square shape. The contact holes 14 have a center coinciding with the center of the first pads 12a. The contact holes 14 receive therein annular contacts 15, which include a titanium nitride film as a barrier metal and a tungsten film filling the contact holes 14 via the barrier metal.

On the second interlevel dielectric film 13 is formed second interconnects (not shown) and second pads (bonding pads) 16 made of Al having a thickness of about 800 nm. The second pads 16 are in contact with the annular contacts 15 at the bottom thereof, and are of a square shape having a side of 100 μm. The second pads 16 are aligned with the underlying first pads 12a. A passivation film 17 overlies second pads 16 and second interlevel dielectric film 13, and has a square opening exposing therethrough the second pads 16 except for the periphery 16a thereof.

In the present embodiment, the inner edge of the annular contact 15 is outside the square opening 17a, as viewed in the vertical direction. This configuration prevents the crack, if occurs within a portion of the second insulating film 13 encircled by the annular contact 15 during a wafer test, from growing toward a portion of the second insulating film 13 outside the annular contact 15. Thus, the crack does not reach the second interconnects. In addition, the first pad 12a, annular contact 15 and second pad 16 defining a closed space configure a barrier against the ingress of water toward outside the closed space.

In manufacture of the semiconductor device of the present embodiment, the underlying elements are formed using known techniques, and the first interlevel dielectric film 11 is formed thereon. Subsequently, aluminum (Al) is deposited using a known physical vapor deposition (PVD) technique to a thickness of about 400 nm, and patterned using a known photolithographic and etching technique to form first interconnects and first pads 12a.

Thereafter, silicon oxide is deposited using a plasma-enhanced CVD technique to a thickness of about 200 nm. Then, the resultant silicon oxide film is planarized using a spin-on-glass (SOG) technique using molten silicon oxide and subjected to annealing. Silicon oxide is further deposited on the annealed silicon oxide to a thickness of about 400 nm, thereby forming the second interlevel dielectric film 13 having a thickness of above 600 nm. The second interlevel dielectric film 13 may be formed using a HDP (High Density Plasma Deposition) technique or a CMP (Chemical-Mechanical Polishing) technique instead.

Thereafter, the second interlevel dielectric film 13 is patterned using a photolithographic and etching technique to form the annular contact holes 14 having a width of about 0.5 μm and exposing a portion of the first pads 12a. The width of the annular contact holes 14 is not limited to any size; however, it is preferable that the width be such that the contacts do not have a concave or convex top surface depending on the material of the contact pads.

Thereafter, titanium nitride is deposited using a PVD technique to a thickness of 20 nm, tungsten is then deposited thereon to a thickness of about 500 nm. The portion of the titanium nitride and tungsten deposited on top of the interlevel dielectric film is then etched for removal thereof. This process provides the annular structure for the contact pads 15 having a titanium nitride film and a nitride film. The removal of the titanium nitride and tungsten may be performed using a CMP technique.

Thereafter, Al is deposited using a PVD technique to a thickness of about 800 nm, followed by patterning thereof using a photolithographic and etching technique to form second interconnects and second pads 16 therefrom. Subsequently, silicon nitride is deposited using a CVD technique to a thickness of about 800 nm, followed by patterning thereof to form openings 17a for exposing therethrough the second pads 16 except for the periphery thereof.

Figure 2:
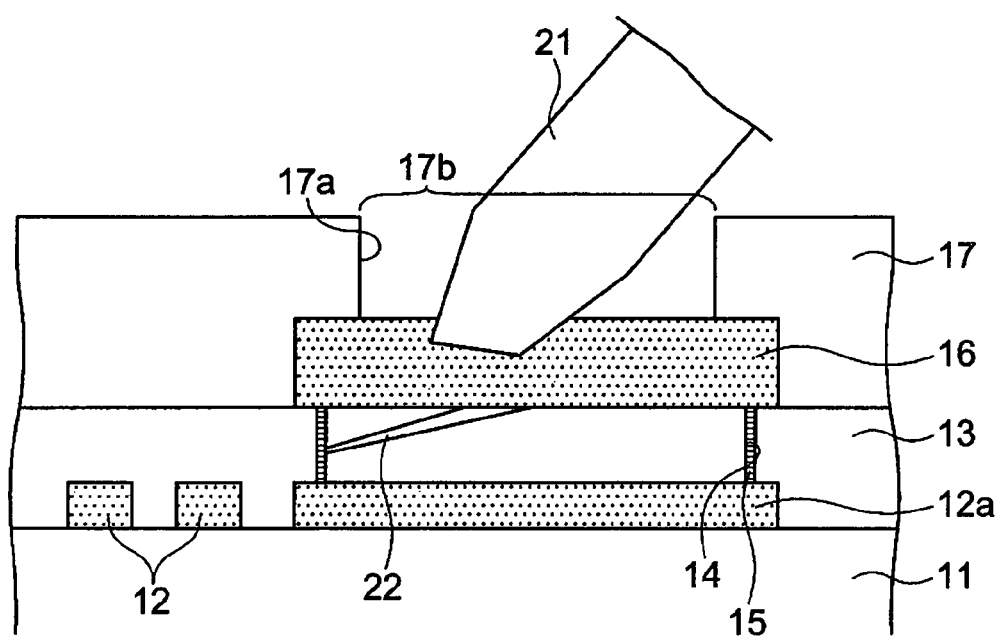
FIG. 2 is a sectional view of the bonding pad of FIGS. 1A and 1B during a wafer test using a probe pin.

FIG. 2 shows the bonding pad structure of the present embodiment during a wafer test. The thrust force applied by the probe pin 21 onto the second pad 16 may create a crack 22 in the portion of the second insulating film 13 underlying the second pad 16. The crack 22 may grow toward the first pad 12a or toward the annular contact 15. The crack growing in the vertical direction toward the first pad 12a is blocked by the first pad 12 and does not grow any more. The crack 22 growing substantially in parallel to the substrate surface toward the annular contact 15 is blocked by the annular contact 15, and does not grow any more. Thus, the crack created by the probe pin 21 is restricted within the space of the annular contact 15 between the first pad 12a and the second pad 16.

As described above, the annular contact 15 acts as a guard ring against the growth of crack, suppressing the ingress of water into the underlying or adjacent interconnects and underlying active elements to improve the reliability of the semiconductor device.

Figure 3A:
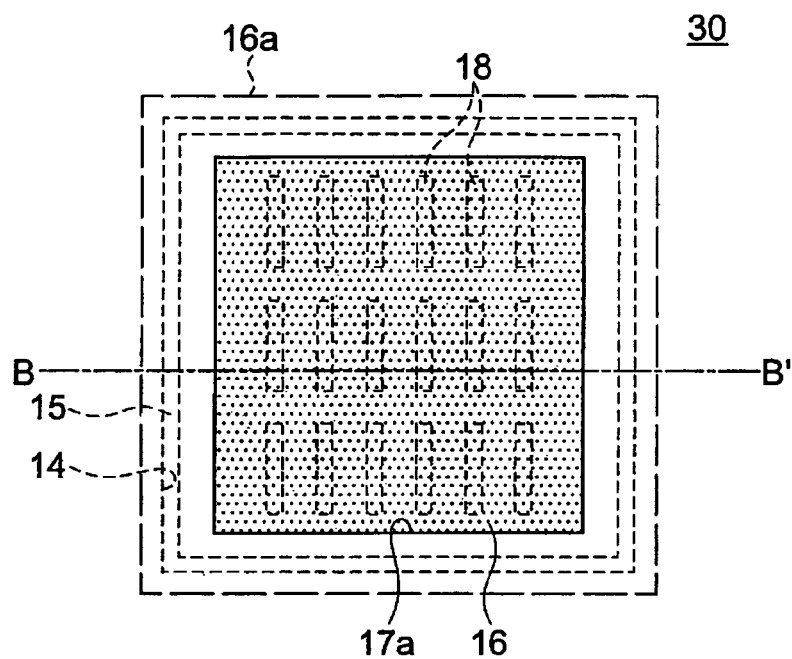
FIG. 3A is a top plan view of a bonding pad formed in a semiconductor device according to a second embodiment of the present invention.
Figure 3B:
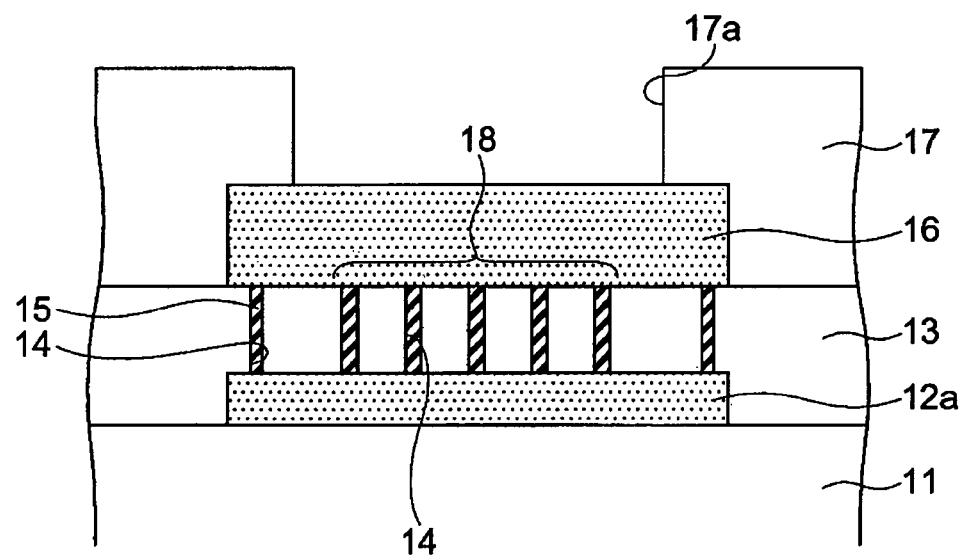
FIG. 3B is a sectional view taken along line B-B' in FIG. 3A.

FIG. 3A shows a bonding pad structure in a semiconductor device according to a second embodiment of the present invention, and FIG. 3B shows a sectional view taken along line B-B' in FIG. 3A. The bonding pad structure in the present embodiment is similar to the bonding pad structure in the first embodiment except for reinforcement contacts provided between the first pad 12a and the second pad 16 in the present embodiment.

More specifically, the contact structure between the first pad 12a and the second pad 16 includes an annular contact 15 similar to that in the first embodiment, and a plurality of reinforcement contacts 18 formed as rectangular plates. The reinforcement contacts 18 are arranged in an array within the annular contact 15. The reinforcement contacts 18 can be formed concurrently with the annular contact 15 by patterning of a metallic layer.

The annular contact 15 and reinforcement contacts 18 in combination bear the thrust applied to the first pad 16, whereby the load applied to the contacts 15, 18 is distributed among them and prevent a larger stress from being applied onto a specific location of the insulating film 13. The reinforcement contacts 18 formed separately from the annular contact 15 prevent a stress concentration at a specific position of the contact. This prevents occurring of the crack in the insulating film adjacent to the specific position of the contact. The planar shape of the reinforcement contacts 18 prevents generation of an uneven top surface of the contact. The array arrangement of the reinforcement contacts 18 reduces the horizontal length of each reinforcement contact 18, thereby preventing a larger stress from being applied to both ends of the reinforcement contact 18, which would be possibly applied onto a longer-size reinforcement contact.

The parallel arrangement of the reinforcement contacts 18 reduces the stress applied to a specific location of the second insulating film 13.

Figure 4A:
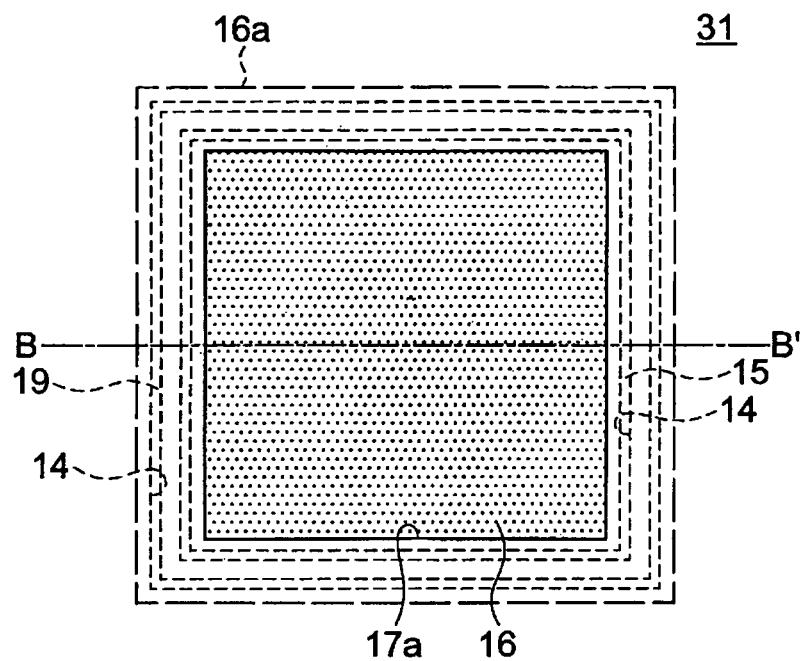
FIG. 4A is a top plan view of a bonding pad formed in a semiconductor device according to a third embodiment of the present invention.
Figure 4B:
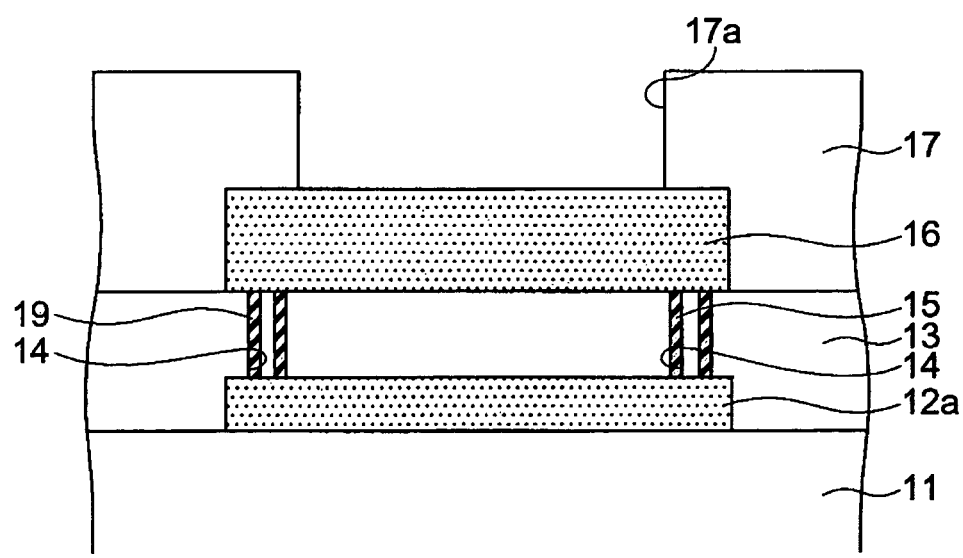
FIG. 4B is a sectional view taken along line B-B' in FIG. 4A.
Figure 5A:
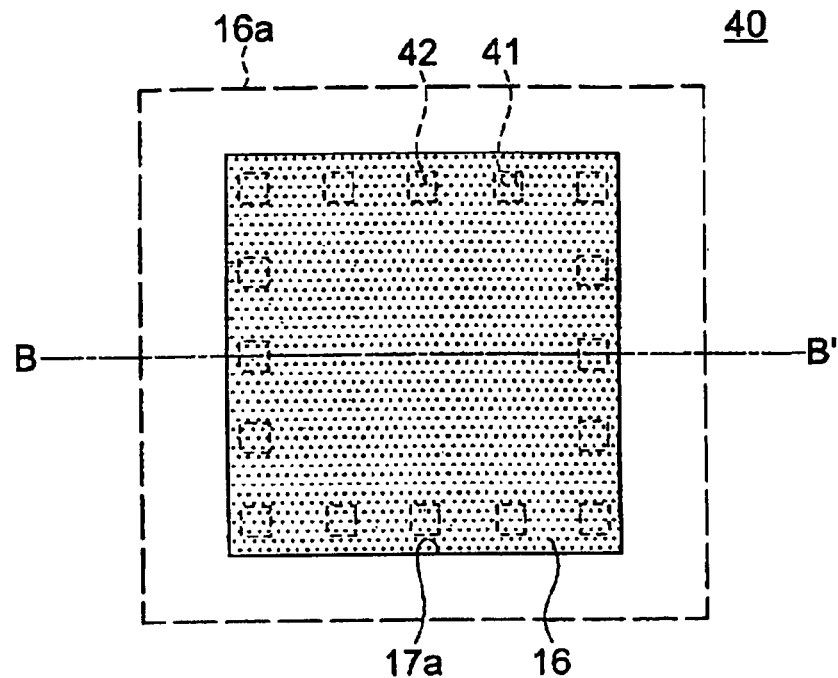
FIG. 5A is a top plan view of a bonding pad formed in a conventional semiconductor.
Figure 5B:
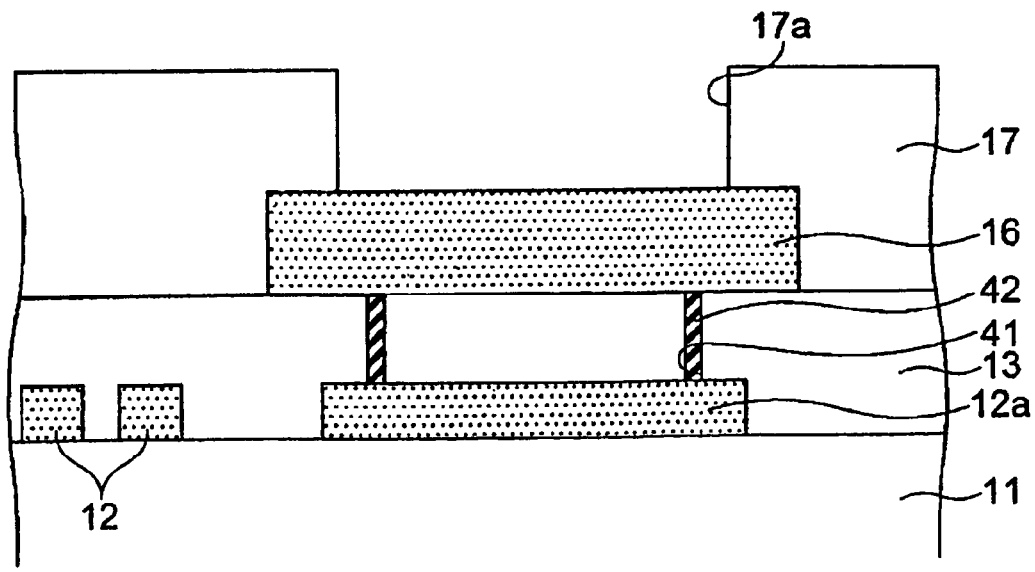
FIG. 5B is a sectional view taken along line B-B' in FIG. 5A.

FIG. 4A shows a bonding pad structure in a semiconductor device according to a third embodiment of the present invention, and FIG. 4B shows a sectional view taken along line B-B' in FIG. 4A. The bonding pad structure in the present embodiment is similar to that in the first embodiment except that double annular contacts 15, 19 are provided in the present embodiment. More specifically, the contact structure includes first and second annular contacts 15, 19, wherein the second annular contact 19 is disposed outside the first annular contact 15 which is similar to that in the first embodiment.

According to the third embodiment, the double annular contacts 15, 19 prevent growing of the secondary crack, which may occur in the case of the single annular contact, although the possibility of occurring of the secondary crack itself is low. The second annular contact 19 is formed concurrently with the first annular contact 15 by patterning of a metallic layer. The reinforcement contacts 18 in the second embodiment may be disposed within the area of the first annular contact 15.

Since the above embodiments are described only for examples, the present invention is not limited to the above embodiments and various modifications or alterations can be easily made therefrom by those skilled in the art without departing from the scope of the present invention.

For example, although the combination of the first pad, second pad and annular contact defines a closed space in the present embodiment, the combination need not necessarily define an entirely closed space, and it is sufficient that the combination effectively block most of the growth routes of the crack.

What is claimed is:

1. A semiconductor device comprising:
   a substrate;
   a first pad overlying said substrate and connected to an interconnect;
   an insulating film formed on said first pad;
   a second pad formed on said insulating film and overlying said first pad;
   a passivation film formed on said second pad and having an opening to expose therethrough at least a central area of said second pad the central area of the second pad exposed by the opening of the passivation film being capable of making a direct contact with a probe pin; and
   an annular contact disposed within said insulating film between said first pad and said second pad for connecting together said first pad and said second pad, said annular contact continuously surrounding said opening as viewed normal to said substrate and having an innermost edge outside the opening as viewed normal to said substrate to be completely hidden by the passivation film as viewed normal to the substrate.

2. The semiconductor device according to claim 1, wherein said first pad, said second pad and said annular contact define a closed space receiving therein a portion of said insulating film.

3. The semiconductor device according to claim 1, further comprising another annular contact disposed within said insulating film between said first pad and said second pad, said another annular contact continuously surrounding said annular contact as viewed normal to said substrate.

4. The semiconductor device according to claim 3, wherein said first pad, said second pad, said annular contact and said another annular contact define a closed space receiving therein a portion of said insulating film.

5. The semiconductor device according to claim 1, further comprising at least one reinforcement contact disposed within said insulating film between said first pad and said second pad, said annular contact encircling said reinforcement contact as viewed normal to said substrate.

6. The semiconductor device according to claim 5, wherein said at least one reinforcement contact include an array of said reinforcement contacts.

7. The semiconductor device according to claim 6, wherein said reinforcement contacts are rectangular plates and disposed parallel to one another.

8. A semiconductor device comprising:
   a substrate;
   a first pad overlying said substrate;
   an insulating film covering said first pad;

a second pad formed on said insulating film and overlying said first pad, said second pad having a lower surface on the insulating film and an upper surface opposing to the lower surface, the upper surface of the second pad including a first inner portion and a first peripheral portion surrounding the first inner portion;

a passivation film covering said second pad and having an opening to expose the first inner portion of the upper surface of the second pad covered by the passivation film while keeping the first peripheral portion of the upper surface of the second pad covered by the passivation film, the lower surface of the second pad thereby including a second inner portion corresponding to the first inner portion of the upper surface and a second peripheral portion corresponding to the first peripheral portion of the upper surface; and an annular contact embedded in said insulating film to form an electrical path between said first and second pads, the annular contact being in contact with the second peripheral portion of the lower surface of the second pad and having an innermost edge outside the opening as viewed normal to said substrate so that the annular contact surrounds a portion of the insulating film under the second inner portion of the lower surface of the second pad.

9. The device as claimed in claim 8, wherein said annular contact is a first annular contact and said device further comprising a second annular contact which is embedded in the insulating film to surround the portion of the insulating film under the second inner portion of the lower surface of the second pad with an intervention of the first annular contact therebetween, the second annular contact being in contact with the second peripheral portion of the lower surface of the second pad.

10. The device as claimed in claim 9, wherein the first inner portion of the upper surface of the second pad exposed by the opening is capable of making a contact with a probe pin.

11. The device as claimed in claim 8, further comprising a plurality of reinforcement contacts embedded in the portion of the insulating film under the second inner portion of the lower surface of the second pad surrounded by the annular contact.

12. The device as claimed in claim 11, wherein the reinforcement contacts are arranged in a matrix of a plurality of rows and columns.

13. The semiconductor device according to claim 1, wherein said first pad, said second pad and said annular contact define a closed space receiving therein a portion of said insulating film; and wherein said closed space is free of further contacts interconnecting said first and second pads.

14. The semiconductor device according to claim 8, wherein said first pad, said second pad and said annular contact define a closed space receiving therein a portion of said insulating film; and wherein said closed space is free of further contacts interconnecting said first and second pads.

* * * * *